(12) United States Patent
Frank

(10) Patent No.: US 7,274,275 B2
(45) Date of Patent: Sep. 25, 2007

(54) BANDPASS FILTER NETWORK AND METHOD FOR BANDPASS FILTERING SIGNALS USING MULTIPLE ACOUSTIC RESONATORS

(75) Inventor: Michael L. Frank, Los Gatos, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 173 days.

(21) Appl. No.: 11/150,497

(22) Filed: Jun. 10, 2005

(65) Prior Publication Data

US 2006/0279381 A1   Dec. 14, 2006

(51) Int. Cl.
*H03H 9/54* (2006.01)
*H03H 9/64* (2006.01)

(52) U.S. Cl. .................. 333/189; 333/193; 333/133

(58) Field of Classification Search .......... 333/193, 333/189, 133
See application file for complete search history.

(56) References Cited

U.S. PATENT DOCUMENTS

| 4,021,761 A | * | 5/1977 | Morii et al. ............. 333/193 |
| 4,037,181 A | * | 7/1977 | Ieki et al. ............... 333/193 |
| 5,963,096 A | * | 10/1999 | Hoshino ................. 330/296 |
| 6,489,862 B1 | * | 12/2002 | Frank ...................... 333/187 |
| 6,879,224 B2 | | 4/2005 | Frank |
| 6,888,411 B2 | * | 5/2005 | Behzad et al. .......... 330/311 |

FOREIGN PATENT DOCUMENTS

| DE | 29 50 896 A1 | * | 6/1981 |
| JP | 56087914 | | 7/1981 |
| JP | 6069749 | | 3/1994 |
| JP | 2001-203555 | * | 7/2001 |

OTHER PUBLICATIONS

Patent Application in Great Britian No. 0611163.7 Search Report dated Aug. 11, 2006.

* cited by examiner

*Primary Examiner*—Barbara Summons

(57) ABSTRACT

A bandpass filter network and method for bandpass filtering signals uses multiple acoustic resonators. The acoustic resonators may be Film Bulk Acoustic Resonators (FBARs) or Surface Acoustic Wave (SAW) resonators. The acoustic resonators are separated by one or more electrical components, for example, transistors of an amplifier, to provide isolation between the acoustic resonators.

19 Claims, 6 Drawing Sheets

BANDPASS FILTER NETWORK AND METHOD FOR BANDPASS FILTERING SIGNALS USING MULTIPLE ACOUSTIC RESONATORS

BACKGROUND OF THE INVENTION

There is a need for very narrow bandwidth bandpass filters for use in wireless communication devices, especially for those operating in Industrial, Scientific and Medical (ISM) bands. The ISM 2.4 band in particular is becoming increasingly crowded with microwave ovens and competing wireless devices. The extraneous signals from microwave ovens and other wireless devices interfere with the proper reception of wanted signals by saturating the input of the receiver. These interferences can be managed by increasing the linearity of the receiver, which requires more current. A more linear receiver will be able to amplify both the small, wanted signals without distortion, as well as the large, unwanted interferers. This more linear receiver will be more sensitive to the wanted signals. However, this solution is not desirable for battery operated wireless communication devices since the extra current shortens battery life. A better solution for battery operated wireless communication devices is to use band pass filters to exclude the bulk of the unwanted signals, which allows for a more power efficient operation, and thus, results in longer battery life.

Unfortunately, conventional active filters do not have the frequency response capable of narrowband operation at these frequencies. It is typical to use active filters after the signal is down converted so that the filter operation is at a much lower frequency. This leaves the electronics between the antenna and up to and including the down converter (also known as the "frontend") susceptible to the unwanted interference. The solution here lies in increasing the bias current into the frontend, but at a cost of reducing battery life.

Currently available passive filters in the ISM 2.4 band also do not have the capability of reducing the bandwidth of the front end. Since battery operated wireless communication devices are preferably small, inexpensive products, the filter types available are limited to ceramic, Surface Acoustic Wave (SAW) and Film Bulk Acoustic Resonator (FBAR). A conventional filter based on ceramic with less than 20 MHz bandwidth is not practical, and a conventional filter based on SAW or FBAR is not possible. The problem for a bandpass filter based on SAW or FBAR is that when the resonators are combined into a filter network, each resonator loads the other resonators. If the resonant frequencies of the resonators are too close, the filter insertion loss soars, making the filter unusable. This phenomenon is illustrated in FIG. 1, which shows that as the bandwidth is reduced, the insertion loss is increased.

In view of these concerns, there is a need for a narrow bandwidth bandpass filter network and method for bandpass filtering signals in a narrow bandwidth of a desired frequency band, such as the ISM 2.4 band.

SUMMARY OF THE INVENTION

A bandpass filter network and method for bandpass filtering signals uses multiple acoustic resonators. The acoustic resonators may be Film Bulk Acoustic Resonators (FBARs) or Surface Acoustic Wave (SAW) resonators. The acoustic resonators are separated by one or more electrical components, for example, transistors of an amplifier, to provide isolation between the acoustic resonators. The isolation provided by the electrical components prevents the acoustic resonators from loading one another, and as a result, the insertion loss is significantly reduced.

A bandpass filter network in accordance with an embodiment of the invention comprises an input node to receive input signals, an output node to transmit output signals, a first acoustic resonator operatively connected to the input node, a second acoustic resonator operatively connected to the output node, and an electrical component positioned between the first and second acoustic resonators. The electrical component provides isolation between the first and second acoustic resonator.

A bandpass filter network in accordance with another embodiment of the invention comprises an input node to receive input signals, an output node to transmit output signals, multiple acoustic resonators connected to a signal path from the input node to the output node, and an amplifier operatively connected to the input and output nodes. The amplifier comprises at least one electrical component positioned between the multiple acoustic resonators to provide isolation between the multiple acoustic resonators.

A method for bandpass filtering signals in accordance with an embodiment of the invention comprises receiving the signals, subjecting the signals to first and second acoustic resonators, and transmitting the signal through an electrical component positioned between the first and second acoustic resonators. The electrical component provides isolation between the first and second acoustic resonators.

Other aspects and advantages of the present invention will become apparent from the following detailed description, taken in conjunction with the accompanying drawings, illustrated by way of example of the principles of the invention.

DETAILED DESCRIPTION

Figure 1:
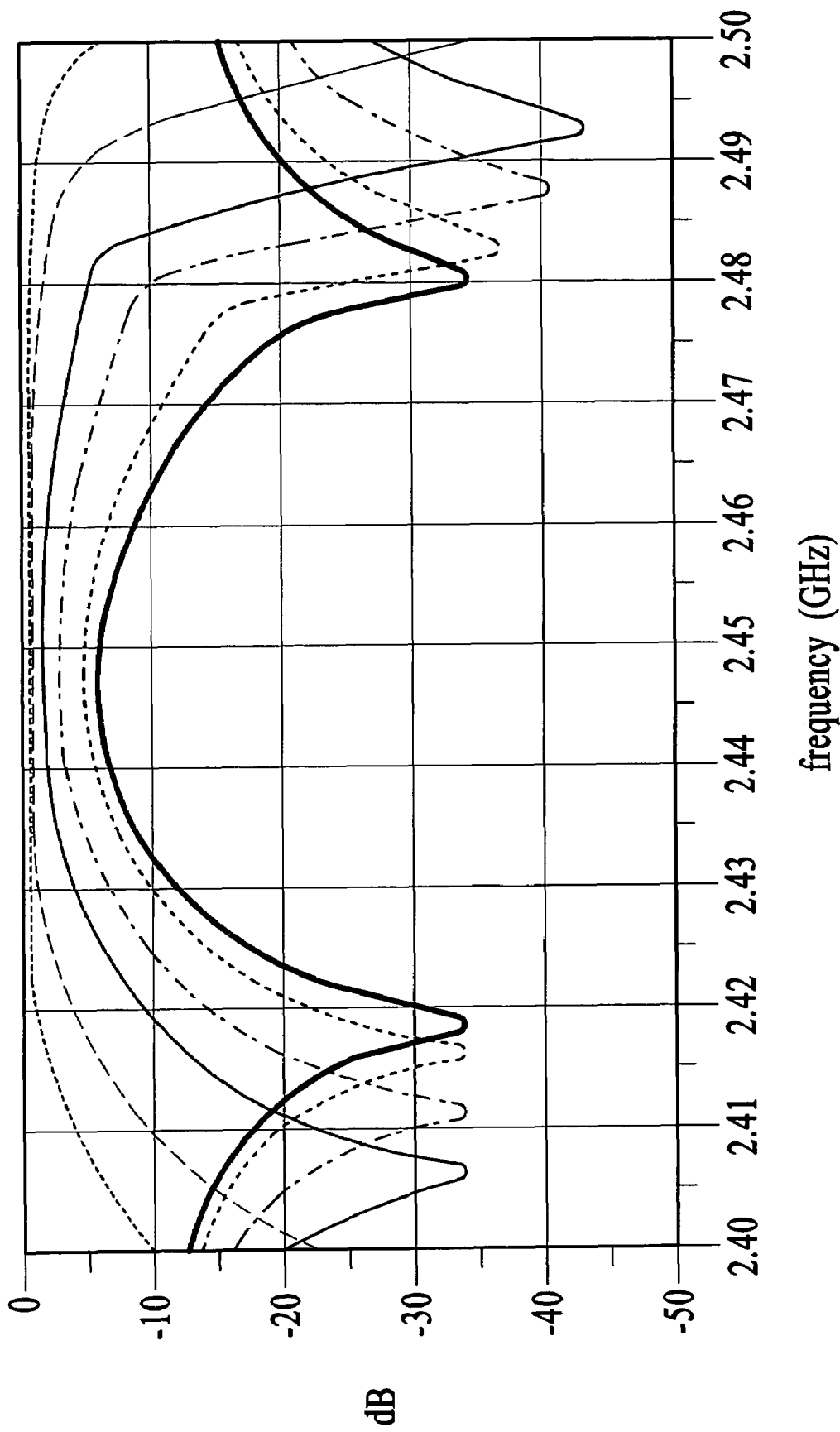
FIG. 1 is a graph showing the relationship between bandwidth and insertion loss using a conventional bandpass filter based on Film Bulk Acoustic Resonators (FBARs).
Figure 2:
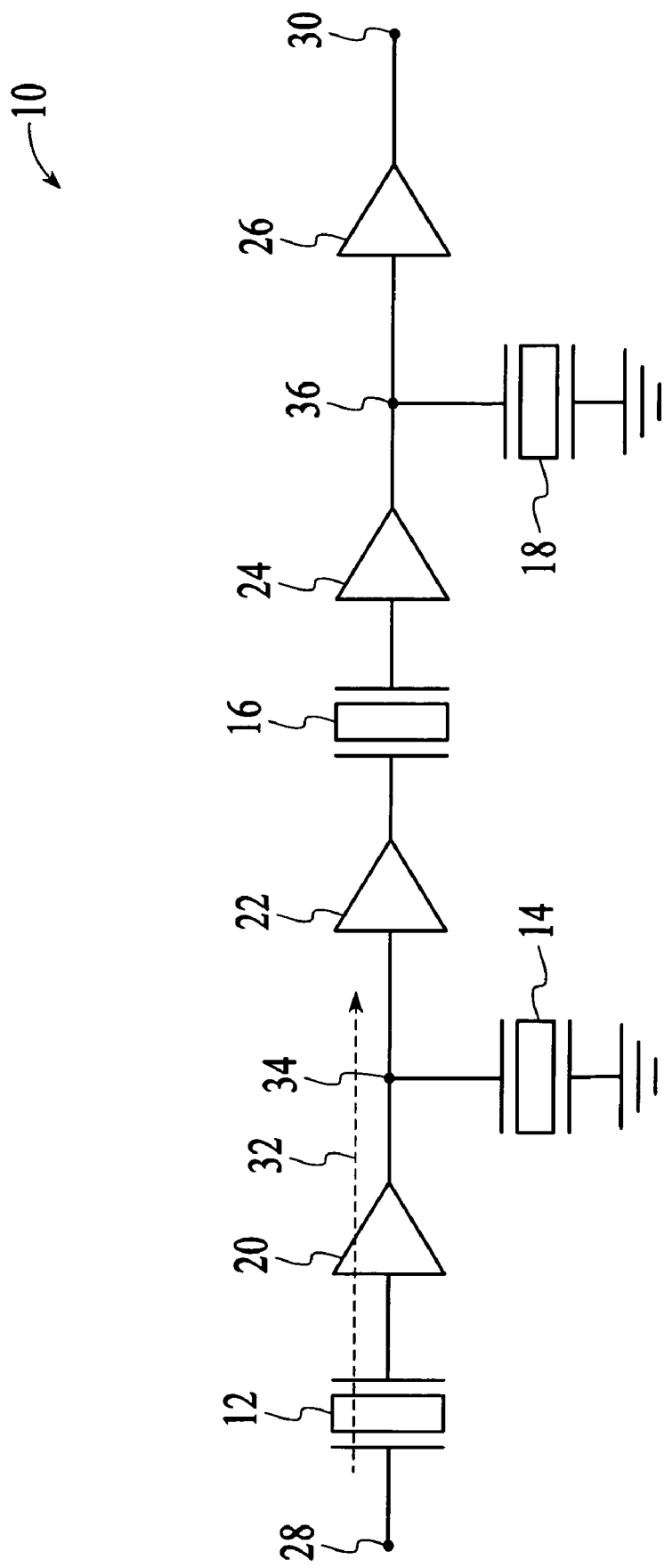
FIG. 2 is a diagram of a narrow bandwidth bandpass filter network in accordance with an embodiment of the invention.

With reference to FIG. 2, a narrow bandwidth bandpass filter network 10 in accordance with an embodiment of the invention is described. The configuration of the bandpass filter network 10 allows acoustic resonators 12, 14, 16 and 18, such as Surface Acoustic Wave (SAW) resonators and Film Bulk Acoustic Resonators (FBARs), to be used to achieve a very narrow bandwidth operation in radio frequency bands, such as Industrial, Scientific and Medical (ISM) bands. The acoustic resonators 12, 14, 16 and 18 of the bandpass filter network 10 are distributed among electrical components 20, 22, 24 and 26 of an amplifier, for example, a frontend amplifier of a wireless communication device. The amplifier components 20, 22, 24 and 26 provide isolation of the acoustic resonators 12, 14, 16 and 18 so that the acoustic resonators are not loading one another, which reduces the insertion loss.

In this embodiment, the bandpass filter network 10 is used to selectively amplify signals in a very narrow bandwidth in an ISM band, e.g., the ISM 2.4 band. However, this type of bandpass filter network 10 may be used to amplify signals in other bands. As shown in FIG. 2, the bandpass filter network 10 includes an input node 28, the acoustic resonators 12, 14, 16 and 18, the amplifier components 20, 22, 24 and 26 and an output node 30. The amplifier components 20, 22, 24 and 26 are positioned between the input node 28 and the output node 30 on a signal path 32 from the input node to the output node. The amplifier components 20, 22, 24 and 26 are active electrical components, for example, transistors. The acoustic resonator 12 is positioned on the signal path 32 between the input node 28 and the amplifier component 20. Thus, the acoustic resonator 12 is connected to the input node 28 and the amplifier component 20 as a series acoustic resonator. Similarly, the acoustic resonator 16 is positioned on the signal path 32 between the amplifier components 22 and 24. The acoustic resonator 14 is connected to the signal path 32 at a node 34 between the amplifier components 20 and 22. The acoustic resonator 14 is also connected to electrical ground. Thus, the acoustic resonator 14 is connected as a shunt acoustic resonator. Similarly, the acoustic resonator 18 is connected to the signal path 32 at a node 36 between the amplifier components 24 and 26, and to ground. In an alternative embodiment, the acoustic resonator 12 is connected as a shunt acoustic resonator, similar to the acoustic resonators 14 and 18. In another alternative embodiment, the acoustic resonator 14 is connected as a series acoustic resonator, similar to the acoustic resonators 12 and 16. The acoustic resonators 12, 14, 16 and 18 are preferably FBARs or SAW resonators. However, the acoustic resonators 12, 14, 16 and 18 may be other types of acoustic resonators.

The acoustic resonators 12, 14, 16 and 18 of the bandpass filter network 10 operate to bandpass filter signals transmitted on the signal path 32 from the input node 28 to the output node 30. That is, the acoustic resonators 12, 14, 16 and 18 operate to selectively allow only the signals in a predefined frequency range of a particular frequency band. As an example, the acoustic resonators 12, 14, 16 and 18 may operate to selectively allow only signals in a frequency range of less than 20 MHz of the ISM 2.4 band. The acoustic resonators 12, 14, 16 and 18 also operate to provide impedance matching between a first device connected to the input node 28 and a second device connected to the output node 30. If the bandpass filter network 10 is used to receive signals, the first device may be an antenna and the second device may be a receiving signal processing circuit. If the bandpass filter network 10 is used to transmit signals, the first device may be a transmitting signal processing circuit and the second device may be an antenna. The amplifier components 20, 22, 24 and 26 of the bandpass filter network 10 operate to amplify the signals transmitted on the signal path 32. As a result, the signals at the output node 30 are amplified and bandpass filtered signals.

Figure 3:
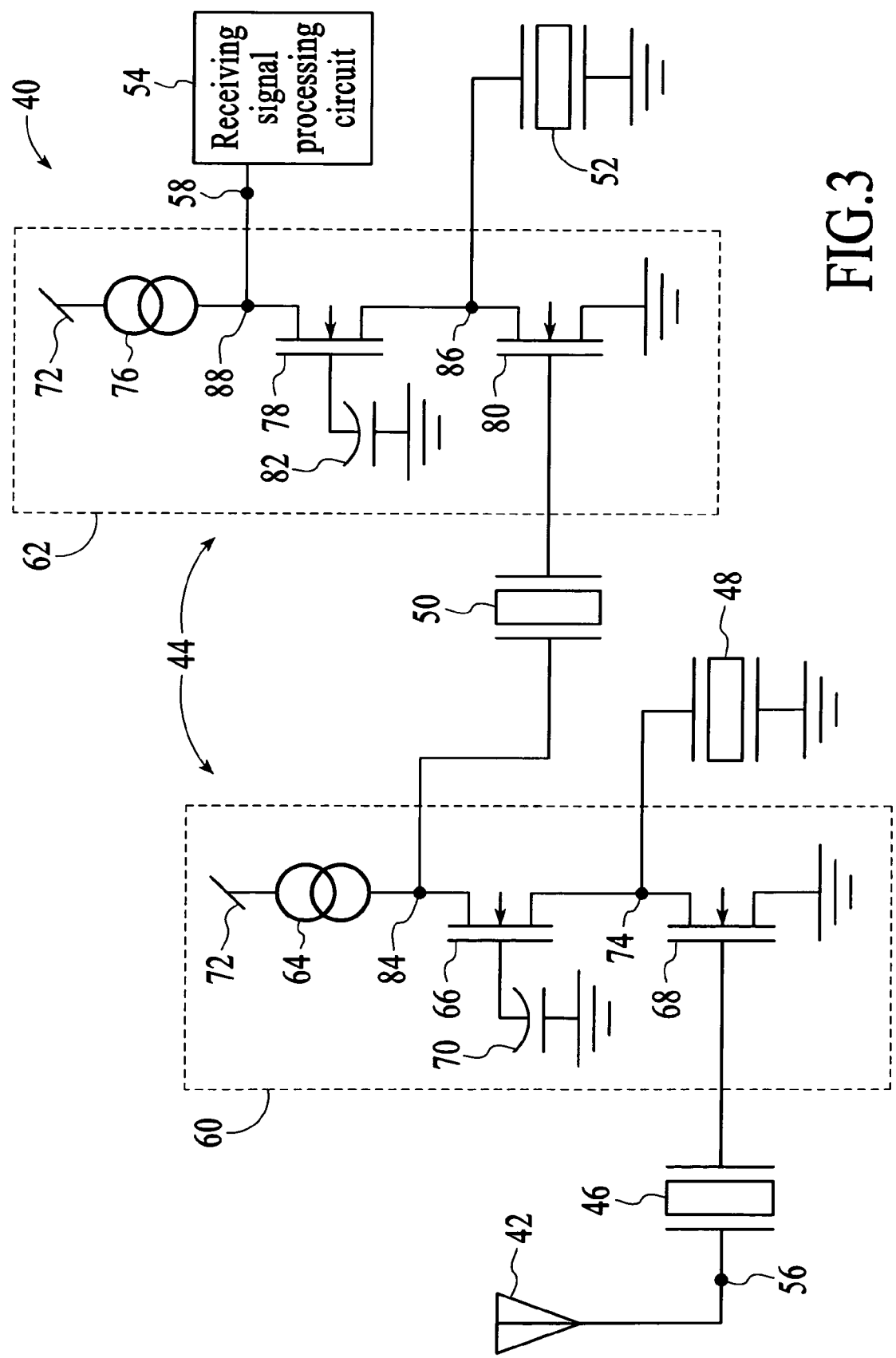
FIG. 3 is a diagram of one implementation of a bandpass filter network in accordance with an embodiment of the invention.

Turning now to FIG. 3, an implementation of a narrow bandwidth bandpass filter network 40 in accordance with an embodiment of the invention is shown. In this implementation, the bandpass filter network 40 is used to receive signals in a very narrow bandwidth, e.g., less than 10 MHz, of an ISM band, e.g., the ISM 2.4 band. However, this type of bandpass filter network 40 may be used to receive signals in other bandwidths of a different frequency band. In this implementation, the bandpass filter network 40 uses FBAR and Complementary Metal Oxide Semiconductor (CMOS) technologies. However, different technologies may be used in other implementations. For example, instead of FBAR and CMOS technologies, the bandpass filter network 40 may use SAW and Bipolar technologies.

As shown in FIG. 3, the bandpass filter network 40 includes an antenna 42, an amplifier 44, FBARs 46, 48, 50 and 52, and a receiving signal processing circuit 54. The antenna 42 is connected to an input node 56, while the receiving signal processing circuit 54 is connected to an output node 58. The amplifier 44 and the FBARs 46, 48, 50 and 52 are connected between the input node 56 and the output node 58 such that the FBARs are distributed among the components of the amplifier, which provide isolation between the FBARs. In this implementation, the FBARs 46, 48, 50 and 52 are structurally identical. However, in other implementations, the FBARs 46, 48, 50 and 52 may be structurally different.

The amplifier 44 includes a first amplifying stage 60 and a second amplifying stage 62. The first amplifying stage 60 includes a current source 64, N-channel Metal Oxide Semiconductor (NMOS) transistors 66 and 68 and a capacitor 70. The current source 64 is connected to a supply voltage terminal 72. The current source 64 may use one or more P-channel Metal Oxide Semiconductor (PMOS) transistors (not shown). The NMOS transistors 66 and 68 are connected in series between the current source 64 and electrical ground in a cascode arrangement. The drain of the NMOS transistor 66 is connected to the current source 64, while the source of the NMOS transistor 66 is connected to the drain of the NMOS transistor 68. The gate of the NMOS transistor 66 is connected to the capacitor 70, which is connected to ground. The source of the NMOS transistor 68 is connected to ground. The gate of the NMOS transistor 68 is connected to the FBAR 46, which is connected to the input node 56 as a series FBAR. The FBAR 48 is connected to a node 74 between the NMOS transistors 66 and 68 as a shunt FBAR. Thus, the FBAR 48 is also connected to ground.

Similar to the first amplifying stage 60, the second amplifying stage 62 also includes a current source 76, NMOS transistors 78 and 80, and a capacitor 82. The current source 76 is connected to the supply voltage terminal 72. The current source 76 may also use one or more PMOS transistors. The NMOS transistors 78 and 80 are connected in series between the current source 76 and electrical ground in a cascode arrangement. The drain of the NMOS transistor 78 is connected to the current source 76, while the source of the NMOS transistor 78 is connected to the drain of the NMOS transistor 80. The gate of the NMOS transistor 78 is connected to the capacitor 82, which is connected to ground. The source of the NMOS transistor 80 is connected to ground. The gate of the NMOS transistor is connected to the FBAR 50, which is connected to the first amplifying stage 60 at a node 84 between the current source 64 and the NMOS transistor 66 as a series FBAR. The FBAR 52 is connected to a node 86 between the NMOS transistors 78 and 80 and to ground. Thus, the FBAR 52 is connected as a shunt acoustic resonator. The output node 58 is connected to a node 88 between the current source 76 and the NMOS transistor 78.

Figure 4:
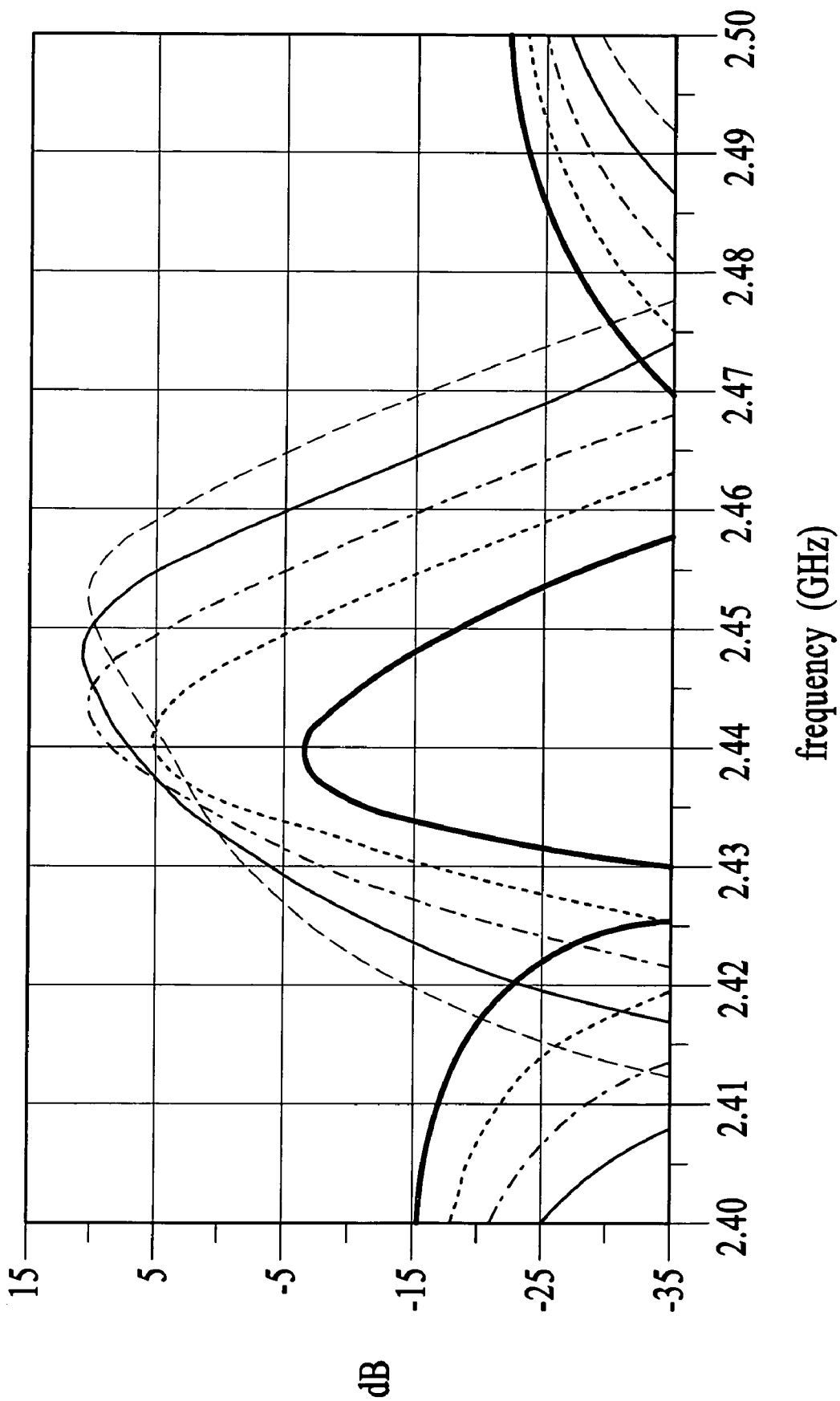
FIG. 4 is a graph showing bandwidth and insertion loss for the bandpass filter network of FIG. 3.

As shown in FIG. 3, each one of the FBARs 46, 48, 50 and 52 of the bandpass filter network 40 is separated by a component of the amplifier 44. The FBARs 46 and 48 are separated by the NMOS transistor 68. Similarly, the FBARs 48 and 50 are separated by the NMOS transistor 66, and the FBARs 50 and 52 are separated by the NMOS transistor 80. Thus, the NMOS transistors 66, 68 and 80 of the amplifier 44 provide isolation between the FBARs 46, 48, 50 and 52 so that the FBARs are not loading one another. As a result, the sensitivity of the receiver is significantly increased when compared with a receiver using a conventional bandpass filter network using FBARs, as illustrated by a graph in FIG. 4, which shows insertion characteristic with respect to frequency.

In an alternative embodiment, the FBAR 46 of the bandpass filter network 40 is connected as a shunt FBAR rather than a series FBAR. The FBAR 50 may also be connected as a shunt FBAR. However, this is not preferred since the series FBAR 50 provides DC blocking.

In operation, signals are received by the antenna 42. The received signals include wanted signals, as well as unwanted signals. The received signals are subjected to the FBARs 46, 48, 50 and 52, which allow only the signals in a predefined frequency range to be transmitted to the receiving signal processing circuit 54. The signals outside of this frequency range are attenuated or blocked by the FBARs 46, 48, 50 and 52. Meanwhile, the signals are amplified by the amplifier 44 as the signals are selectively transmitted from the antenna 42 to the receiving signal processing circuit 54. Thus, the desired signals are transmitted to the receiving signal processing circuit to be processed.

Figure 5:
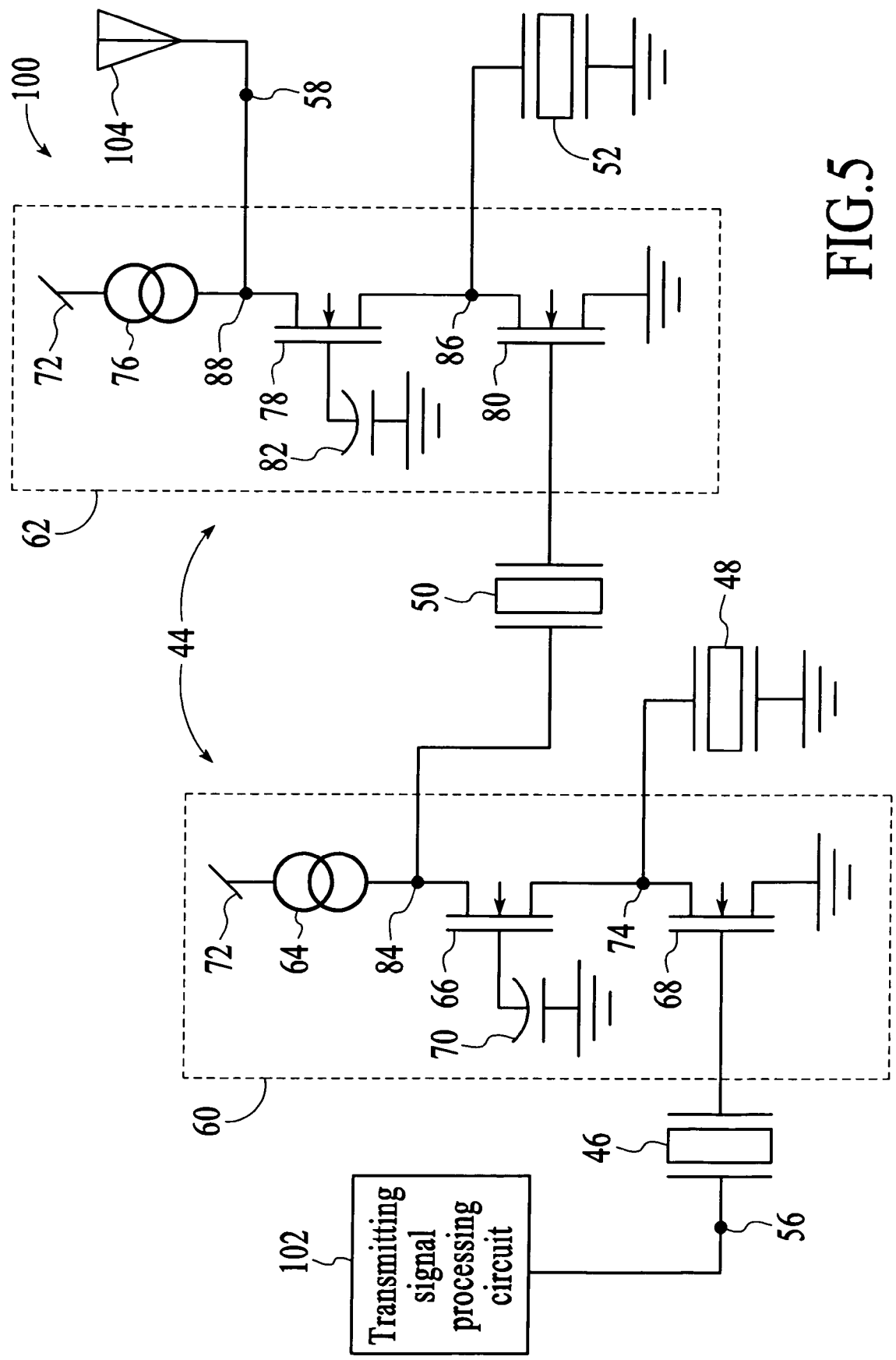
FIG. 5 is a diagram of another implementation of a bandpass filter network in accordance with an embodiment of the invention.

Turning now to FIG. 5, another implementation of a narrow bandwidth bandpass filter network 100 in accordance with an embodiment of the invention is shown. The bandpass filter network 100 of FIG. 5 is similar to the bandpass filter network of FIG. 3. Thus, the same reference numerals of FIG. 3 are used to reference similar elements in FIG. 5. In this implementation, the bandpass filter network 100 is used to transmit signals in a very narrow bandwidth, e.g., less than 10 MHz, of an ISM band, e.g., the ISM 2.4 band. Thus, the bandpass filter network 100 includes a transmitting signal processing circuit 102 connected to the input node 56 and an antenna 104 connected to the output node 58. The transmitting signal processing circuit 102 generates the signals to be transmitted. These signals are then bandpass filtered by the FBARs 46, 48, 50 and 52 and amplified by the amplifier 44 prior to being transmitted from the antenna 104. Although the FBAR 46 is shown to be connected as a series FBAR, in an alternative embodiment, the FBAR 46 may be connected as a shunt FBAR.

Figure 6:
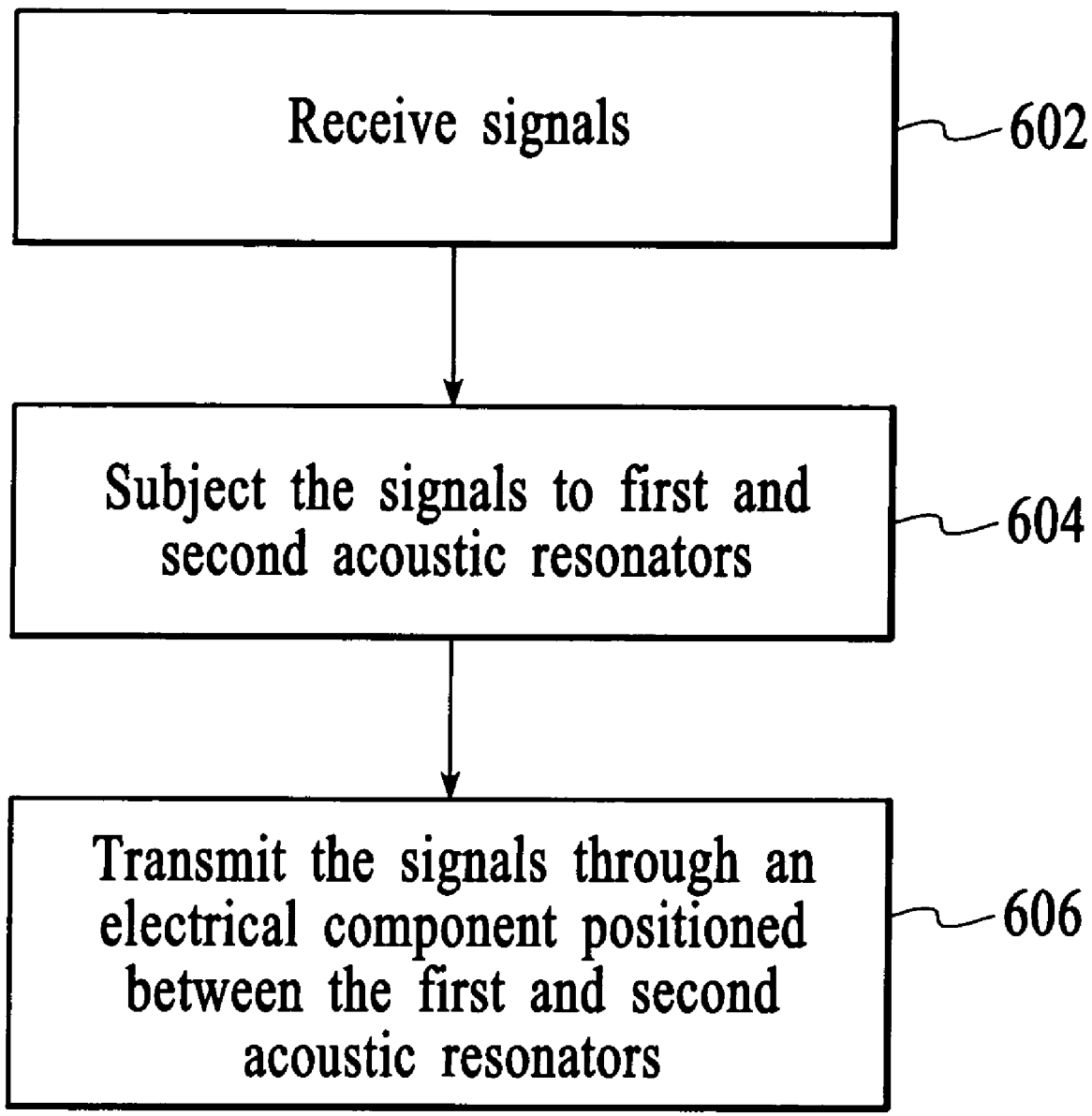
FIG. 6 is a process flow diagram of a method for bandpass filter signals in accordance with an embodiment of the invention.

A method for bandpass filtering signals in accordance with an embodiment of the invention is described with reference to a process flow diagram of FIG. 6. At block 602, signals are received. The received signals include wanted and unwanted signals. Next, at block 604, the signals are subjected to first and second acoustic resonators. The first and second acoustic resonators may be FBARs and/or SAW resonators. Next, at block 606, the signals are transmitted through an electrical component positioned between the first and second acoustic resonators. The electrical component provides isolation between the first and second acoustic resonators. The electrical component may be a transistor, e.g., an NMOS transistor, of an amplifier. As a result, the signals are bandpass filtered and may also be amplified.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A bandpass filter network comprising:
an input node to receive input signals;
an output node to transmit output signals;
a first acoustic resonator operatively connected to the input node;
a second acoustic resonator operatively connected to the output node; and
an electrical component positioned between the first and second acoustic resonators, the electrical component providing isolation between the first and second acoustic resonator,
wherein at least one of the first and second acoustic resonators is connected as a shunt acoustic resonator.

2. The network of claim 1 wherein at least one of the first and second acoustic resonators is one of Film Bulk Acoustic Resonator (FBAR) and Surface Acoustic Wave (SAW) resonator.

3. The network of claim 1 wherein the electrical component is a component of an amplifier.

4. The network of claim 3 wherein the electrical component is a transistor of the amplifier.

5. The network of claim 4 wherein the electrical component is a Metal Oxide Semiconductor (MOS) transistor.

6. The network of claim 1 wherein at least one of the first and second acoustic resonators is connected as a series acoustic resonator with respect to a signal path.

7. The network of claim 1 further comprising an antenna connected to one of the input and output nodes, and one of a receiving signal processing circuit and a transmitting signal processing circuit connected to one of the input and output nodes.

8. A bandpass filter network comprising:
an input node to receive input signals;
an output node to transmit output signals;
multiple acoustic resonators connected to a signal path from the input node to the output node; wherein at least one of the multiple acoustic resonators is connected as a shunt acoustic resonator; and
an amplifier operatively connected to the input and output nodes, the amplifier comprising at least one electrical component positioned between the multiple acoustic resonators to provide isolation between the multiple acoustic resonators.

9. The network of claim 8 further comprising an antenna connected to one of the input and output nodes, and one of a receiving signal processing circuit and a transmitting signal processing circuit connected to one of the input and output nodes.

10. The network of claim 8 wherein at least one of the multiple acoustic resonators is one of Film Bulk Acoustic Resonator (FBAR) and Surface Acoustic Wave (SAW) resonator.

11. The network of claim 10 wherein the electrical component is a transistor.

12. The network of claim 11 wherein the electrical component is a Metal Oxide Semiconductor (MOS) transistor.

13. The network of claim 8 wherein at least one of the multiple acoustic resonators is connected as a series acoustic resonator with respect to the signal path.

14. The network of claim 8 wherein the multiple acoustic resonators includes at least one series acoustic resonator and two shunt acoustic resonators that are connected to the signal path such that the one series acoustic resonator is positioned between the two shunt acoustic resonators.

15. The network of claim 8 wherein the amplifier includes an amplifying stage comprising cascode transistors, the electrical component being one of the cascode transistors.

16. The network of claim 15 wherein the amplifier further includes a second amplifying stage comprising second cascode transistors, one of the multiple acoustic resonators being positioned between the amplifying stage and the second amplifying stage of the amplifier.

17. A method for bandpass filtering signals, the method comprising:
receiving the signals;
subjecting the signals to first and second acoustic resonators, wherein at least one of the first and second acoustic resonators is connected as a shunt acoustic resonator; and
transmitting the signals through an electrical component positioned between the first and second acoustic resonators, the electrical component providing isolation between the first and second acoustic resonators.

18. The method of claim 17 wherein the transmitting includes transmitting the signals through a transistor of an amplifier.

19. The method of claim 17 wherein the subjecting includes subjecting the signals to first and second Film Bulk Acoustic Resonators (FBARs).

* * * * *